(12) United States Patent
Jeong et al.

(10) Patent No.: US 12,062,411 B2
(45) Date of Patent: Aug. 13, 2024

(54) SEMICONDUCTOR DEVICE PERFORMING A MULTIPLICATION AND ACCUMULATION OPERATION

(71) Applicants: SK hynix Inc., Icheon (KR); Korea Advanced Institute of Science and Technology, Daejeon (KR)

(72) Inventors: Minki Jeong, Daejeon (KR); Wanyeong Jung, Daejeon (KR)

(73) Assignees: SK hynix Inc., Icheon (KR); Korea Advanced Institute of Science and Technology, Daejeon (KR)

( * ) Notice: Subject to any disclaimer, the term of this patent is extended or adjusted under 35 U.S.C. 154(b) by 246 days.

(21) Appl. No.: 17/732,272

(22) Filed: Apr. 28, 2022

(65) Prior Publication Data
US 2022/0366946 A1 Nov. 17, 2022

(30) Foreign Application Priority Data
Apr. 30, 2021 (KR) .................. 10-2021-0056140

(51) Int. Cl.
| | |
|---|---|
| *G11C 16/10* | (2006.01) |
| *G11C 7/10* | (2006.01) |
| *G11C 7/12* | (2006.01) |
| *G11C 11/54* | (2006.01) |

(52) U.S. Cl.
CPC .......... *G11C 7/1006* (2013.01); *G11C 7/1048* (2013.01); *G11C 7/12* (2013.01); *G11C 11/54* (2013.01)

(58) Field of Classification Search
CPC ..................................................... G11C 16/10
See application file for complete search history.

(56) References Cited

U.S. PATENT DOCUMENTS

| | | | |
|---|---|---|---|
| 2017/0242632 A1* | 8/2017 | Cho | .................. G06F 3/0655 |
| 2019/0042199 A1 | 2/2019 | Sumbul et al. | |
| 2019/0102170 A1 | 4/2019 | Chen et al. | |
| 2020/0105833 A1 | 4/2020 | Kavalieros | |

OTHER PUBLICATIONS

J. W. Jung et al., "A 25-GB/s 5-mW CMOS CDR/deserializer," 2012 Symposium on VLSI Circuits (VLSIC), Honolulu, HI, USA, 2012, pp. 138-139, doi: 10.1109/VLSIC.2012.6243828.
B. Razavi, "Charge steering: A low-power design paradigm," Proceedings of the IEEE 2013 Custom Integrated Circuits Conference, San Jose, CA, USA, 2013, pp. 1-8, doi: 10.1109/CICC.2013.6658443, 2013.

(Continued)

*Primary Examiner* — Jason Lappas

(57) ABSTRACT

A semiconductor device includes a cell block and a data block. The cell block includes an operation circuit having a first capacitor and a second capacitor and an input circuit configured to couple the first capacitor and the second capacitor to a bit line according to differential voltages provided via word lines and corresponding to a first data. The data block includes a capacitor array having a variable capacitance corresponding to a value of a second data; and a coupling switch configured to couple the bit line and the data block. The cell block and the data block may be used to perform a Multiply and Accumulate (MAC) operation.

15 Claims, 11 Drawing Sheets

(56) References Cited

OTHER PUBLICATIONS

Biswas et al., "Conv-RAM: An energy-efficient SRAM with embedded convolution computation for low-power CNN-based machine learning applications", IEEE International Solid—State Circuits Conference, 2018.
Seshadri et al., "Ambit: In-Memory Accelerator for Bulk Bitwise Operations Using Commodity DRAM Technology", 50th Annual IEEE/ACM International Symposium on Microarchitecture, 2017.
S. Li, et al., "DRISA: A DRAM-based Reconfigurable In-Situ Accelerator", 50th Annual IEEE/ACM International Symposium on Microarchitecture, 2017.
B. Razavi, "Charge steering: A low-power design paradigm", Proceedings of the IEEE Custom Integrated Circuits Conference, 2013.
J.W. Jung, et al., "A 25-GB/s 5-mW CMOS CDR/Deserializer" IEEE Journal of Solid-State Circuits, vol. 48, No. 3, Mar. 2013.

\* cited by examiner

SEMICONDUCTOR DEVICE PERFORMING A MULTIPLICATION AND ACCUMULATION OPERATION

CROSS-REFERENCE TO RELATED APPLICATIONS

The present application claims priority under 35 U.S.C. § 119(a) to Korean Patent Application No. 10-2021-0056140, filed on Apr. 30, 2021, which is incorporated herein by reference in its entirety.

BACKGROUND

1. Technical Field

Various embodiments relate to a semiconductor device performing a multiplication and accumulation (MAC) operation.

2. Related Art

Neural networks are widely used in artificial intelligence applications, such as image recognition and technologies used in autonomous vehicles.

In an example, a neural network includes an input layer, an output layer, and one or more inner layers disposed between the input layer and the output layer.

Each of the output layer, the input layer, and the inner layers includes one or more neurons. Neurons contained in adjacent layers are coupled in various ways through synapses. For example, synapses may point from neurons in a given layer to neurons in a next layer. Alternately or additionally, synapses may point to neurons in a given layer from neurons in a previous layer.

Each of the neurons stores a value. The values of the neurons included in the input layer are determined according to an input signal, for example, an image to be recognized. The values of the neurons contained in the inner and output layers are based on the neurons and synapses contained in corresponding previous layers. For example, the values of the neurons in each of the inner layers are based on the values of the neurons in a preceding layer in the neural network.

Each of the synapses has a weight. The weight of each of the synapses may be determined by a training operation of the neural network.

After the neural network is trained, the neural network can be used to perform an inference operation. In the inference operation, the values of the neurons in the input layer are set based on an input, and the values of the neurons in the next layers (that is, the inner layers and the output layer) are determined based on the values of the neurons in the input layer and the trained synapses connecting the layers. The values of the neurons in the output layer represent a result of the inference operation.

In a neural network operation such as described above, multiplication and accumulation (MAC) operations are frequently performed, and the importance of an operation circuit capable of efficiently performing MAC operations is increasing.

Conventional MAC operation circuits in a memory device substantially modify an existing memory structure or have a structure requiring an external circuit, which causes deterioration of the existing memory performance and an increase in area and power consumption.

A conventional MAC operation circuit may perform a MAC operation using a current flowing through a transistor. In this method, the accuracy of the operation is deteriorated because it is affected by noise, mismatch, Process-Voltage-Temperature (PVT) variations, and the like.

A conventional MAC operation circuit generally does not use multi-bit data or weights, but is limited to a structure using 1-bit data or weights, so there is a limit in terms of computational accuracy. If multi-bit operations are performed, the area of the circuit may be excessively increased or the operation efficiency may become low because only a part of the cell array is used when performing the MAC operation.

SUMMARY

In accordance with an embodiment of the present disclosure, a semiconductor device may include a cell block including: an operation circuit having a first capacitor and a second capacitor; and an input circuit configured to couple the first capacitor and the second capacitor to a bit line according to differential voltages provided via word lines and corresponding to a first data; a data block including a capacitor array having capacitance corresponding to a second data; and a coupling switch configured to couple the bit line and the data block.

In accordance with an embodiment of the present disclosure, a semiconductor device may include a plurality of word lines, a plurality of bit lines, a plurality of cell blocks arranged in a matrix form; a data block array including a plurality of data blocks; and a coupling switch array including a plurality of coupling switches coupling the plurality of bit lines with the plurality of the data blocks, wherein each of the plurality of cell blocks includes: an operation circuit having a first capacitor and a second capacitor; and an input circuit configured to couple the first capacitor and the second capacitor to a bit line according to a differential voltage provided via a word line and corresponding to a first data; wherein each of the plurality of data blocks includes a capacitor array having capacitance corresponding to a second data; and wherein one of the plurality of cell blocks and one of the plurality of data blocks are paired to perform a Multiplication and an Accumulation (MAC) operation.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments that include various features, and explain various principles and beneficial aspects of those embodiments.

DETAILED DESCRIPTION

Various embodiments will be described below with reference to the accompanying figures. Embodiments are provided for illustrative purposes and other embodiments that are not explicitly illustrated or described are possible. Further, modifications can be made to embodiments of the present disclosure that will be described below in detail.

Figure 1:
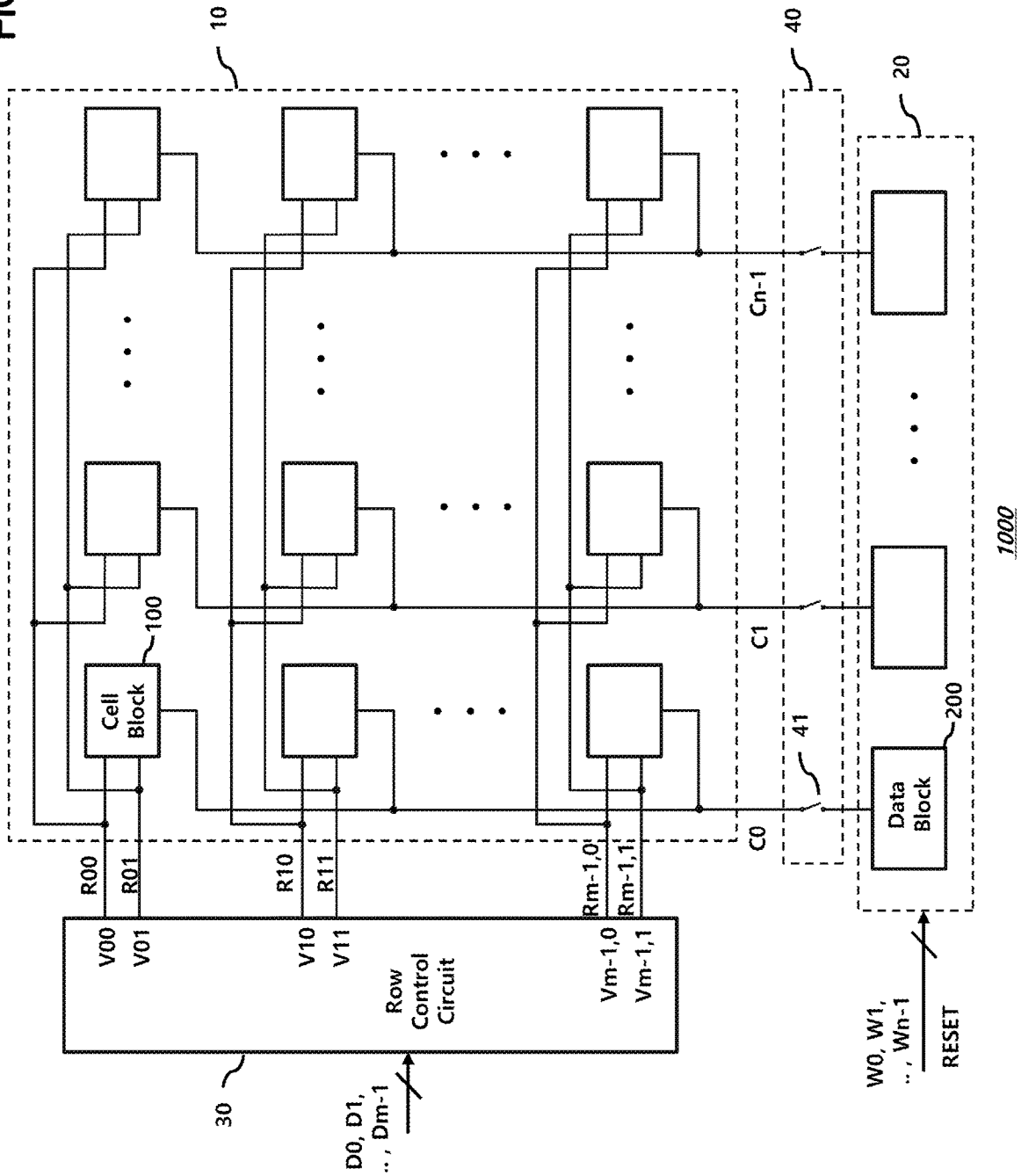
FIG. 1 illustrates a semiconductor device according to an embodiment of the present disclosure.

FIG. 1 is a block diagram illustrating a semiconductor device 1000 according to an embodiment of the present disclosure.

The semiconductor device 1000 includes a cell array 10 including a plurality of cell blocks 100 arranged in rows and columns, an data block array 20 including a plurality of data blocks 200, a row control circuit 30 providing an input voltage to the plurality of cell blocks 100, and a plurality of coupling switches 41 connecting a plurality of column lines of the cell array 10 to the data block array 20.

The plurality of cell blocks 100 each have substantially the same structure, in which cell blocks belonging to the same row share a row line, and cell blocks belonging to the same column share a column line.

A row line may be referred to as a word line, and a column line may be referred to as a bit line.

For example, the cell block 100 is coupled to two row lines R00 and R01 to receive two differential voltages V00 and V01.

Hereinafter, the row line R00 may be referred to as a first row line or a first word line, and the row line R01 may be referred to as a second row line or a second word line.

Also, the differential voltage V00 may be referred to as a first differential voltage V00 and the differential voltage V01 may be referred to as a second differential voltage V01.

The cell block 100 is coupled to a corresponding data block 200 through the column line C0 and a coupling switch 41.

The row control circuit 30 generates a plurality of differential voltages V00, V01, V10, V11, ..., Vm−1,0, Vm−1,1 according to a plurality of first data D0, D1, ..., Dm−1, wherein a difference between differential voltages Vx0 and Vx1 corresponds to a value of first data Dx for each x in 0 to m−1.

In this embodiment, each of the plurality of first data D0 to Dm−1 is a multi-bit digital signal.

For example, the row control circuit 30 may convert the first data D0 into an analog voltage to generate a first differential voltage V00 and a second differential voltage V01.

In this case, the first differential voltage V00 and the second differential voltage V01 may be expressed as Equations 1 and 2, respectively.

In Equations 1 and 2, Vcm is a fixed voltage corresponding to a common voltage, and Vin0 is first input voltage which has a value corresponding to the first data D0.

$$V00 = Vcm + \tfrac{1}{2} Vin0 \quad \text{[Equation 1]}$$

$$V01 = Vcm - \tfrac{1}{2} Vin0 \quad \text{[Equation 2]}$$

Figure 2:
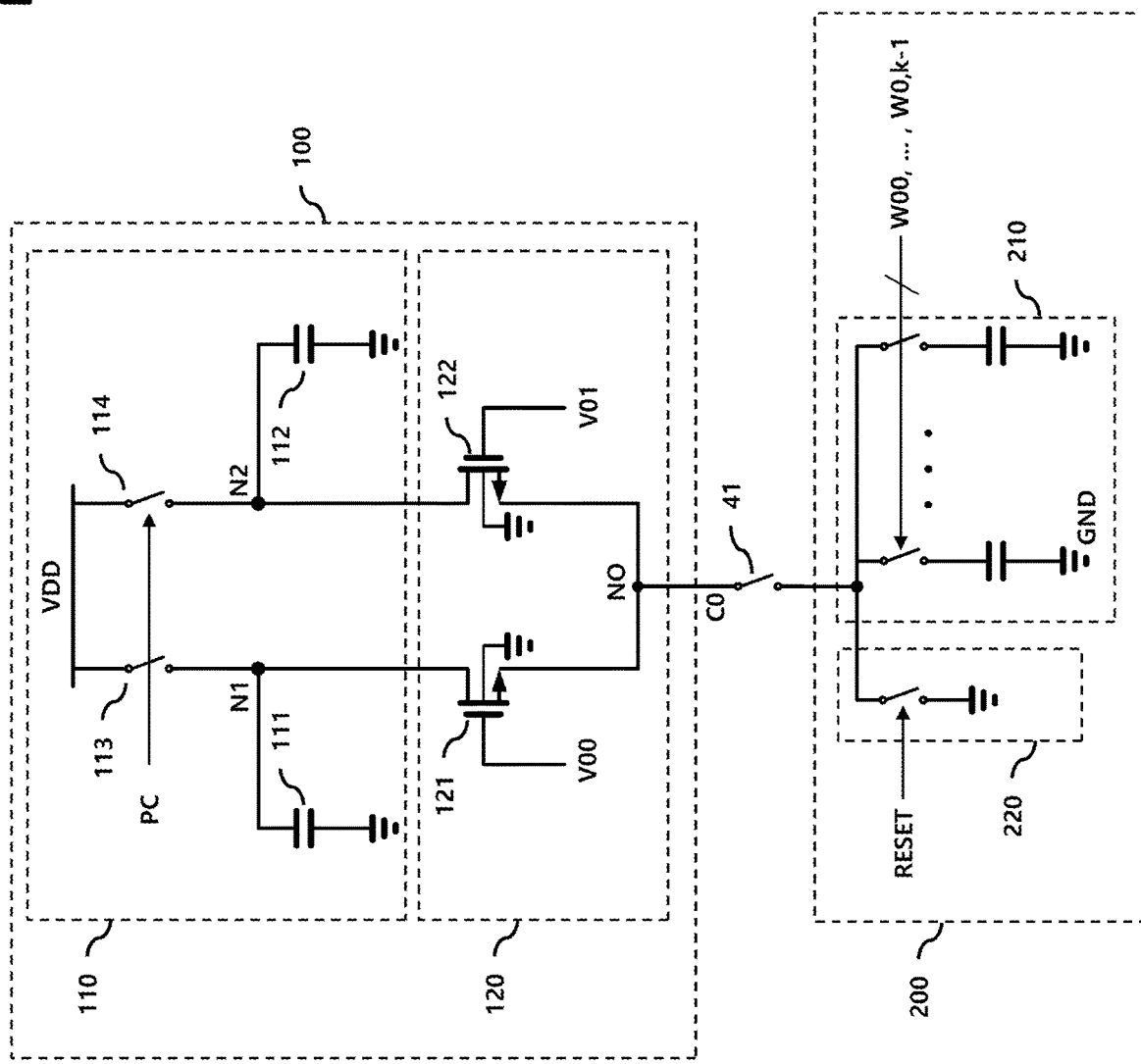
FIG. 2 illustrates a cell block and a data block according to an embodiment of the present disclosure.

FIG. 2 is a block diagram illustrating a cell block 100 and a data block 200 according to an embodiment of the present disclosure.

The cell block 100 includes a operation circuit 110 and an input circuit 120.

The operation circuit 110 includes a first capacitor 111 and a second capacitor 112.

One terminal of the first capacitor 111 is coupled to the second power source GND, and the other terminal is coupled to the first precharge switch 113 at the first node N1.

One terminal of the second capacitor 112 is coupled to the second power source GND and the other terminal is coupled to the second precharge switch 114 at the second node N2.

When a precharge signal PC is activated, the first precharge switch 113 couples the first node N1 to the first power source VDD and the second precharge switch 114 couples the second node N2 to the first power source VDD. In an embodiment, the precharge signal PC is coupled to respective first and second precharge switches in each of the cell blocks 100 of the cell array 10 of FIG. 1, such that all of the cell blocks 100 are precharged simultaneously. In another embodiment, a separate precharge signal PC is provided for each column of cell blocks 100, such that cell blocks 100 in each column of the cell array 10 are precharged simultaneously. In another embodiment, a separate precharge signal PC is provided for each row of cell blocks 100, such that cell blocks 100 in each row of the cell array 10 are precharged simultaneously.

The first capacitor 111 and the second capacitor 112 store result of a MAC operation. A specific MAC operation is disclosed below.

The input circuit 120 includes a first transistor 121 and a second transistor 122.

The first differential voltage V00 is input to a gate of the first transistor 121, and a drain thereof is coupled to the first node N1.

The second differential voltage V01 is input to a gate of the second transistor 122, and a drain thereof is coupled to the second node N2.

Sources of the first transistor 121 and the second transistor 122 are commonly coupled to the output node NO.

The data block 200 includes a capacitor array 210 and a reset circuit 220.

The capacitor array 210 includes a plurality of pairs coupled in parallel between the switch 41 and the second power source GND, where each pair includes a capacitor and a switch coupled in series. Switches of the plurality of pairs are controlled by multi-bit digital signals W00, ..., W0,k−1 to adjust the capacitance of the capacitor array 210.

In this case, the multi-bit digital signals W00, ..., W0,k−1 are signals corresponding to the second data W0.

For example, the multi-bit digital signals W00, ..., W0,k−1 may be signals obtained by encoding the second data W0 into a thermometer code.

At this time, the total capacitance of the capacitor array 210 corresponds to sum of the capacitances of the capacitors coupled to turned-on switches.

Hereinafter, the total capacitance of the capacitor array 210 is denoted as C2.

The reset switch 220 couples the coupling switch 41 to the second power source GND according to the reset signal RESET, and accordingly, the voltage at both terminals of a capacitor included in the capacitor array 210 is grounded to discharge all the charges stored therein.

Figure 3:
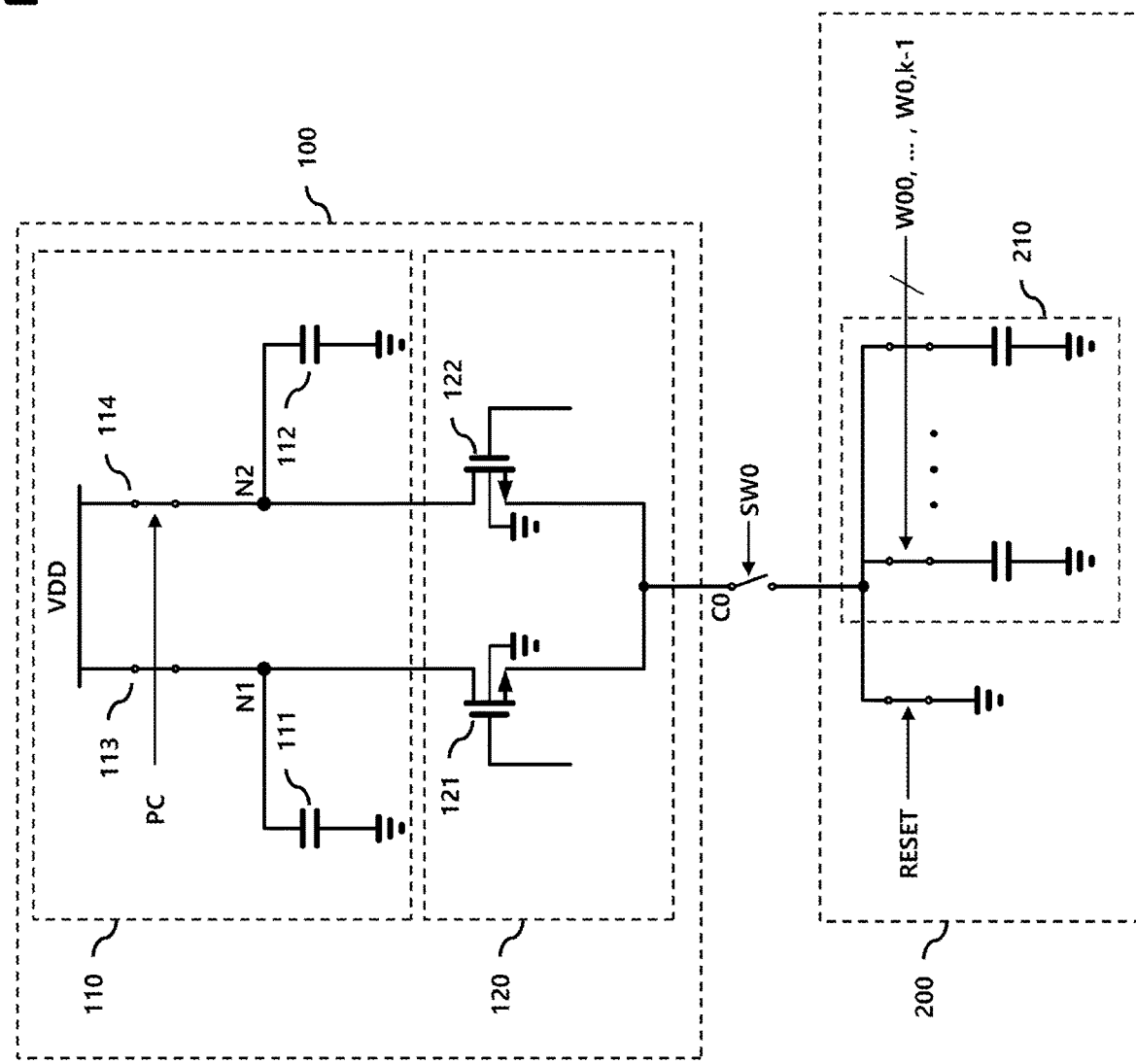
FIGS. 3, 4, and 5 illustrate operations of the cell block and the data block according to an embodiment of the present disclosure.
Figure 4:
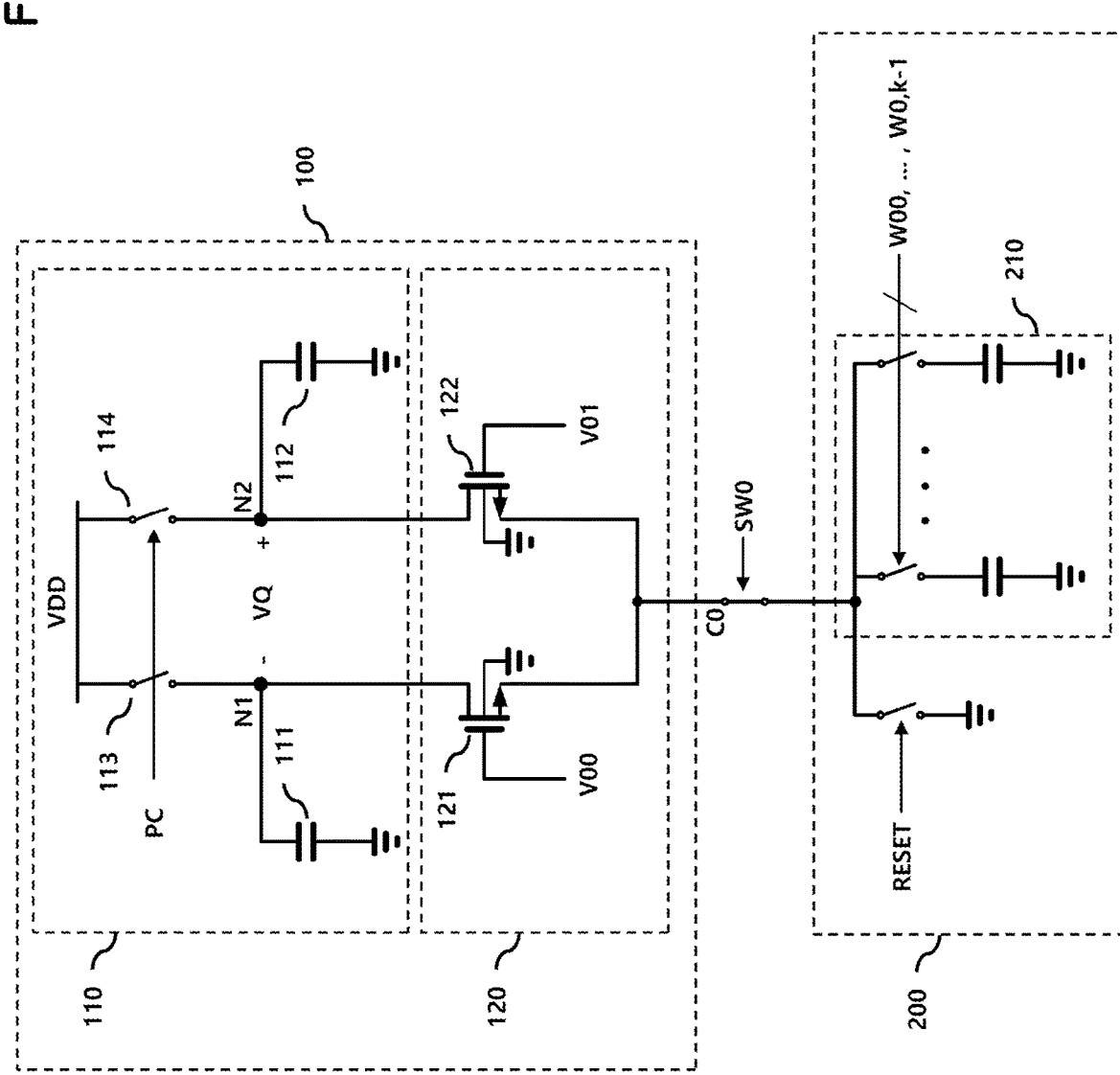
Figure 5:
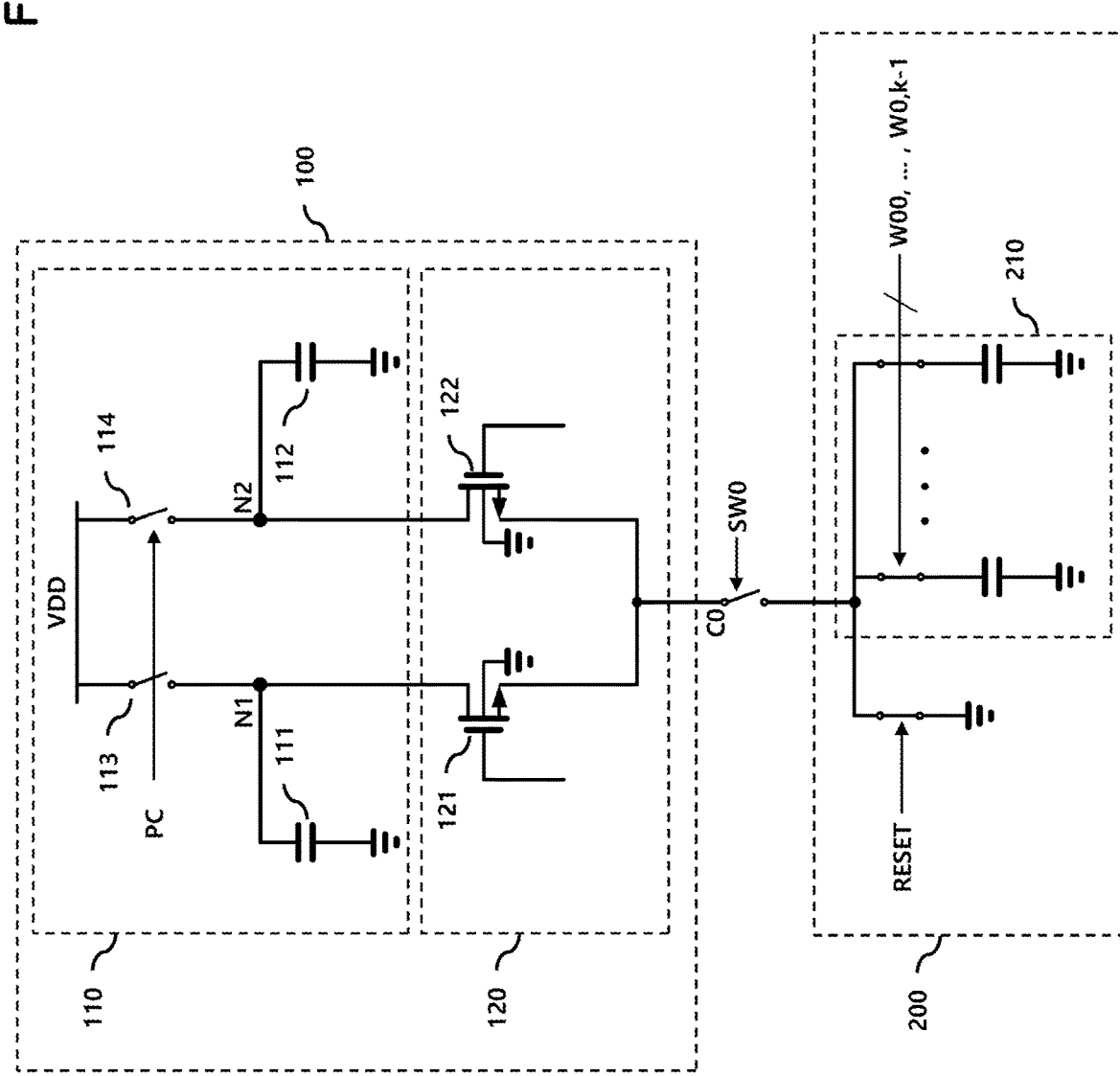

FIGS. 3 to 5 are explanatory diagrams for explaining an operation of a cell block and a data block according to an embodiment of the present disclosure.

A MAC operation is performed in the order of a reset stage, a MAC stage, and a standby stage.

FIG. 3 shows a reset stage.

During the reset stage, capacitors of the capacitor array 210 are discharged by activating the reset signal RESET.

Also, when the precharge signal PC is activated, the first capacitor 111 and the second capacitor 112 are coupled between the first power source VDD and the second power source GND and charged.

During the reset stage, the coupling switch 41 is turned off to separate the cell block 100 and the data block 200, and the first transistor 121 and the second transistor 122 are turned off to isolate the first capacitor 111 and the second capacitor 112 cell block 100 from the capacitors of the other cell blocks 100 coupled to the same bit line C0. To this end, a ground voltage may be provided to the gates of the first transistor 121 and the second transistor 122.

All switches included in the capacitor array 210 may be turned on for the reset operation.

FIG. 4 shows a MAC stage.

During the MAC stage, the reset signal RESET and the precharge signal PC are deactivated, and the coupling switch 41 is turned on.

The first differential voltage V00 is input to the gate of the first transistor 121, and the second differential voltage V01 is input to the gate of the second transistor 122. Values of the first differential voltage V00 and the second differential voltage V01 should be controlled so that the first transistor 121 and the second transistor 122 operate in the saturation region.

Charges precharged in the first capacitor 111 and the second capacitor 112 are discharged according to the differential voltage applied to the input circuit 120, and accordingly, capacitors of the capacitor array 210 are charged.

Hereinafter, it is assumed that the first differential voltage V00 and the second differential voltage V01 are expressed by Equations 1 and 2, and respective capacitances of the first capacitor 111 and the second capacitor 112 are each C1, and capacitance of the capacitor array 210 is C2.

Also, a voltage obtained by subtracting the voltage of the first node N1 from the voltage of the second node N2 is referred to as an output voltage VQ.

In this case, it is known that the relationship between the output voltage VQ and the input voltage Vin0 can be expressed by Equation 3 when the magnitude of the input voltage Vin0 is sufficiently small according to articles such as 「 J. W. Jung and B. Razavi, "A 25-Gb/s 5-mWCMOS CDR/deserializer," 2012 Symposium on VLSI Circuits (VLSIC), Honolulu, HI, USA, 2012, pp. 138-139, doi: 10.1109/VLSIC.2012.6243828.」 and 「 B. Razavi, "Charge steering: A low-power design paradigm," Proceedings of the IEEE 2013 Custom Integrated Circuits Conference, San Jose, CA, USA, 2013, pp. 1-8, doi: 10.1109/CICC.2013.6658443.」. In this case, it is assumed that the coupling switch 41 is turned on for a predetermined time and then turned off.

$$VQ = K \times Vin0 \times \frac{C2}{C1} \qquad \text{[Equation 3]}$$

In Equation 3, the input voltage Vin0 is a voltage corresponding to the first data D0, and C2 is a capacitance corresponding to the second data W0 as described above.

Accordingly, the output voltage VQ has a relationship in which the multiplication result of the first data D0 and the second data W0 is multiplied by a constant K.

FIG. 5 shows a standby stage.

During the standby stage, the reset signal RESET is activated, the precharge signal PC and the switching signal SW0 are deactivated, and the first transistor 121 and the second transistor 122 are turned off. To this end, a ground voltage may be provided to the gates of the first transistor 121 and the second transistor 122.

All switches included in the capacitor array 210 may be turned on for the standby operation.

Accordingly, the multiplication result is accumulated in the first capacitor 111 and the second capacitor 112.

The MAC stage and the standby stage may be repeatedly performed while changing the first data and the second data.

Since the first transistor 121 and the second transistor 122 operate in the saturation region during the MAC stage, when the MAC stage and the standby stage are performed repeatedly, the multiplication results may be superposed in the first capacitor 111 and the second capacitor 112 so that the final MAC operation result is stored in the first capacitor 111 and the second capacitor 112, and as described above, the magnitude of the output voltage VQ can be expressed according to the following Equation 4.

$$VQ = \sum_i K \times Vin_i \times \frac{C2_i}{C1} \qquad \text{[Equation 4]}$$

As shown in Equation 4, the final output voltage VQ corresponds to a result of multiplication and accumulation between the plurality of first data and the plurality of second data.

Since each of the plurality of first data and the plurality of second data can be viewed as a multidimensional vector, the cell block 100 may be expressed as storing result of a dot product operation between the two multidimensional vectors.

When the cell block 100 is arranged in the form of an array as shown in FIG. 1, the dot product operation between a plurality of multidimensional vectors can be performed in parallel, thereby speeding up the neural network operation.

In order to read the output voltage VQ and process it, the first node N1 and the second node N2 of the cell block 100 may be coupled to an output terminal, and the output voltage VQ may be directly read through the output terminal.

Various techniques may be used to read and process the output voltage VQ, but since these are outside the scope of the present invention, a detailed description thereof will be omitted.

FIGS. 6 to 9 are block diagrams each illustrating a cell block and a data block according to other embodiments of the present disclosure.

Figure 6:
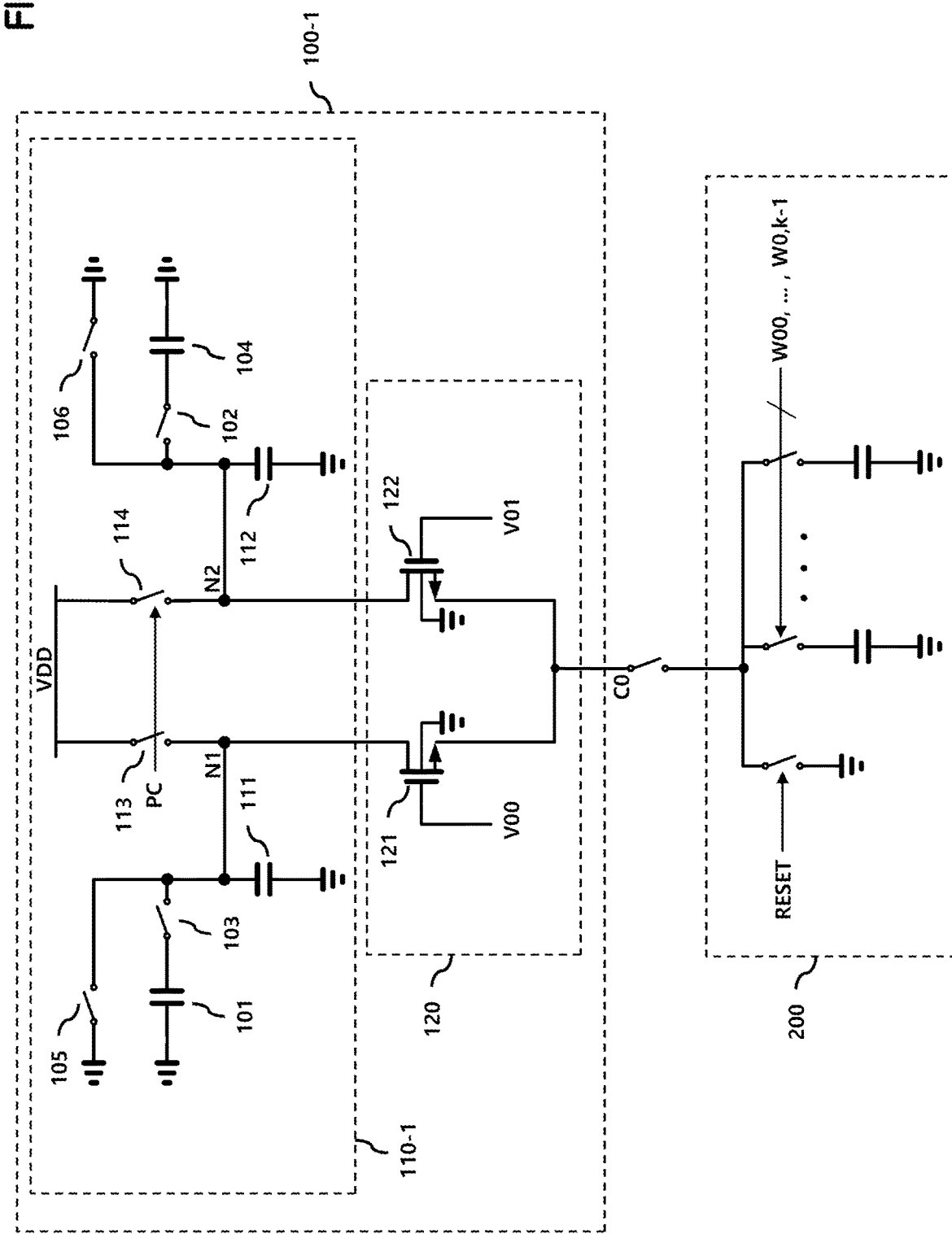
FIGS. 6, 7, 8 and 9 each illustrate a cell block and a data block according to respective embodiments of the present disclosure.

The operation circuit 110-1 included in the cell block 100-1 in FIG. 6 is different from the operation circuit 110 of FIG. 2 in that it further includes a separate accumulation capacitor for accumulating the multiplication result and a switch therefor.

The operation circuit 110-1 includes a first accumulation capacitor 101 and a switch 103 coupled in series between a first node N1 and a second power source GND, a second accumulation capacitor 102 and a switch 104 coupled in series between a second node N2 and a second power source GND, a switch 105 coupled in parallel to the first capacitor 111, and a switch 106 coupled in parallel to the second capacitor 112.

Unlike the embodiment described with respect to FIG. 2, the first capacitor 111 and the second capacitor 112 in FIG. 6 are always precharged before a multiplication operation is performed.

That is, in the embodiment of FIG. 2, the multiplication operation and the accumulation operation may be repeated after one precharge operation, but in the embodiment of FIG. 6, the precharge operation, the multiplication operation, and the accumulation operation are repeated.

Also, unlike the embodiment described with respect to FIG. 2, in the accumulation operation of the embodiment of FIG. 6, a charge of the first capacitor 111 is transferred to the first accumulation capacitor 101, and a charge of the second capacitor 112 is transferred to the second accumulation capacitor 102. For this purpose, the switches 103 and 104 are turned on.

In order to transfer the charges of the first capacitor 111 and the second capacitor 112 to the first accumulation capacitor 101 and the second accumulation capacitor 102 by charge redistribution, it is preferable that the respective capacitance Cacc of the first accumulation capacitor 101 and the second accumulation capacitor 102 is much larger than the capacitance C1 of the first capacitor 111 and the second capacitor 112.

Switches 103 and 105 may be used to initialize the first accumulation capacitor 101, and switches 104 and 106 may be used to initialize the second accumulation capacitor 102.

A repeated description of the same configuration as in the embodiment of FIG. 2 will be omitted.

Figure 7:
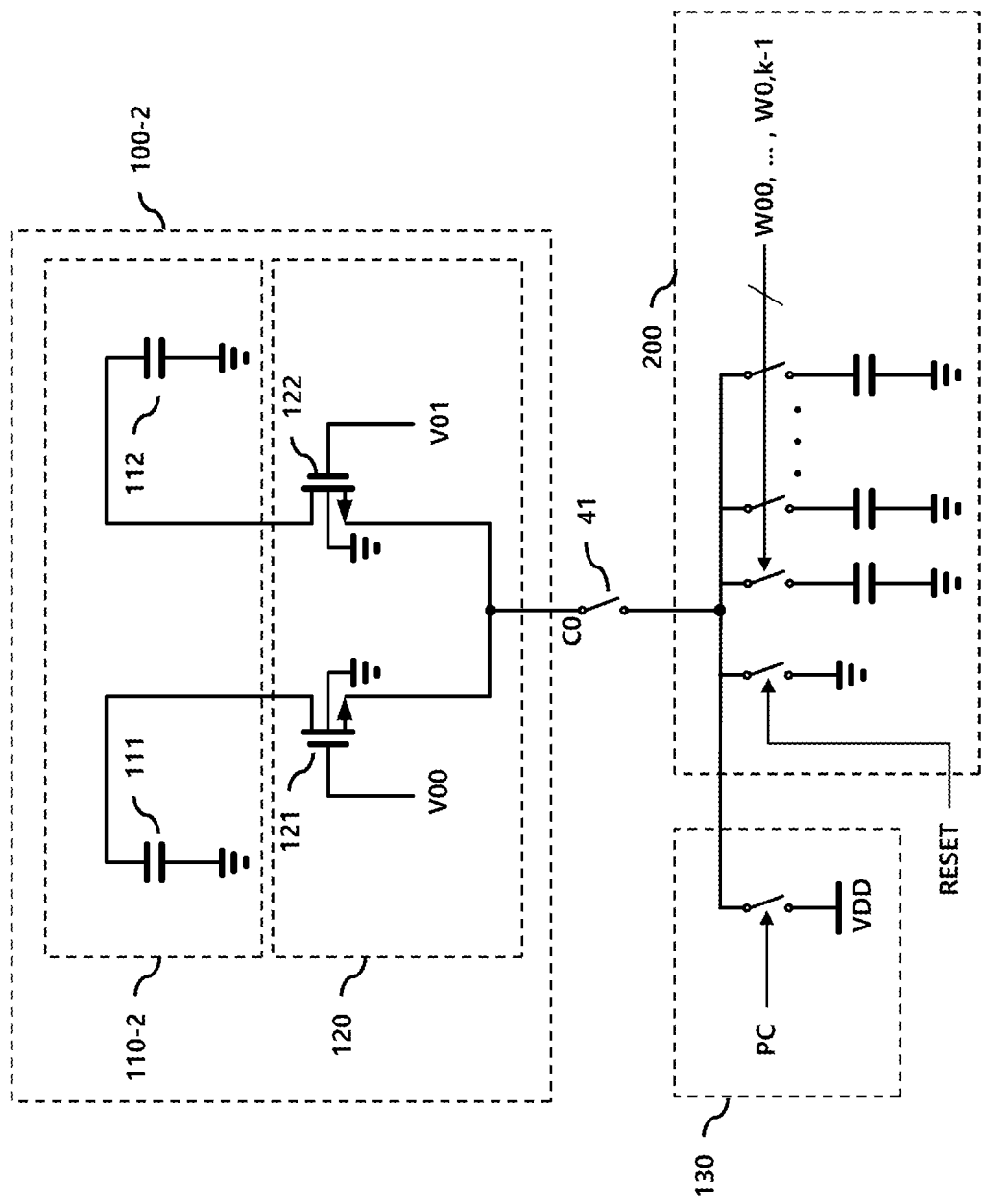

In the embodiment of FIG. 7, the operation circuit 110-2 included in the cell block 100-2 does not include a switch for a precharge operation.

Instead, the precharge switch 130 for the reset stage is coupled in parallel to the data block 200.

The precharge switch 130 connects one terminal of the coupling switch 41 to the first power source VDD according to the precharge signal PC.

The embodiment of FIG. 7 is different from the embodiment of FIG. 2 in that the reset operation and the precharge operation are not performed at the same time because the coupling switch 41 is turned on during the reset stage.

Figure 8:
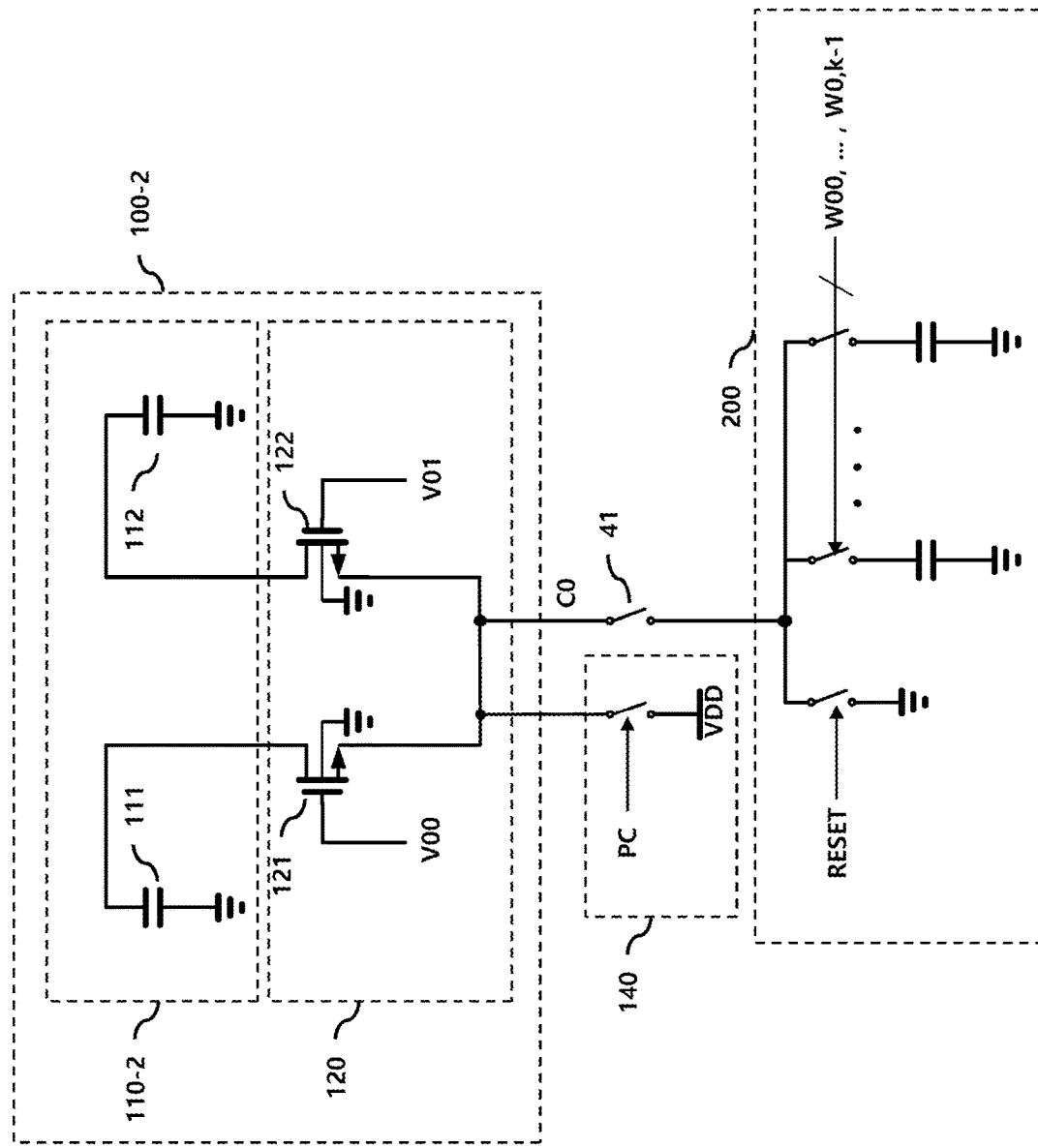

The embodiment of FIG. 8 is different from the embodiment of FIG. 7 in that the precharge switch 140 is directly coupled to the bit line C0.

In the embodiment of FIG. 8, the coupling switch 41 may be turned off during the reset stage, and accordingly, the precharge operation and the reset operation may be performed simultaneously.

In the embodiments of FIGS. 7 and 8, the precharge switches 130 and 140 do not need to be included in each cell block 100 and only one precharge switch may be included in each column.

Figure 9:
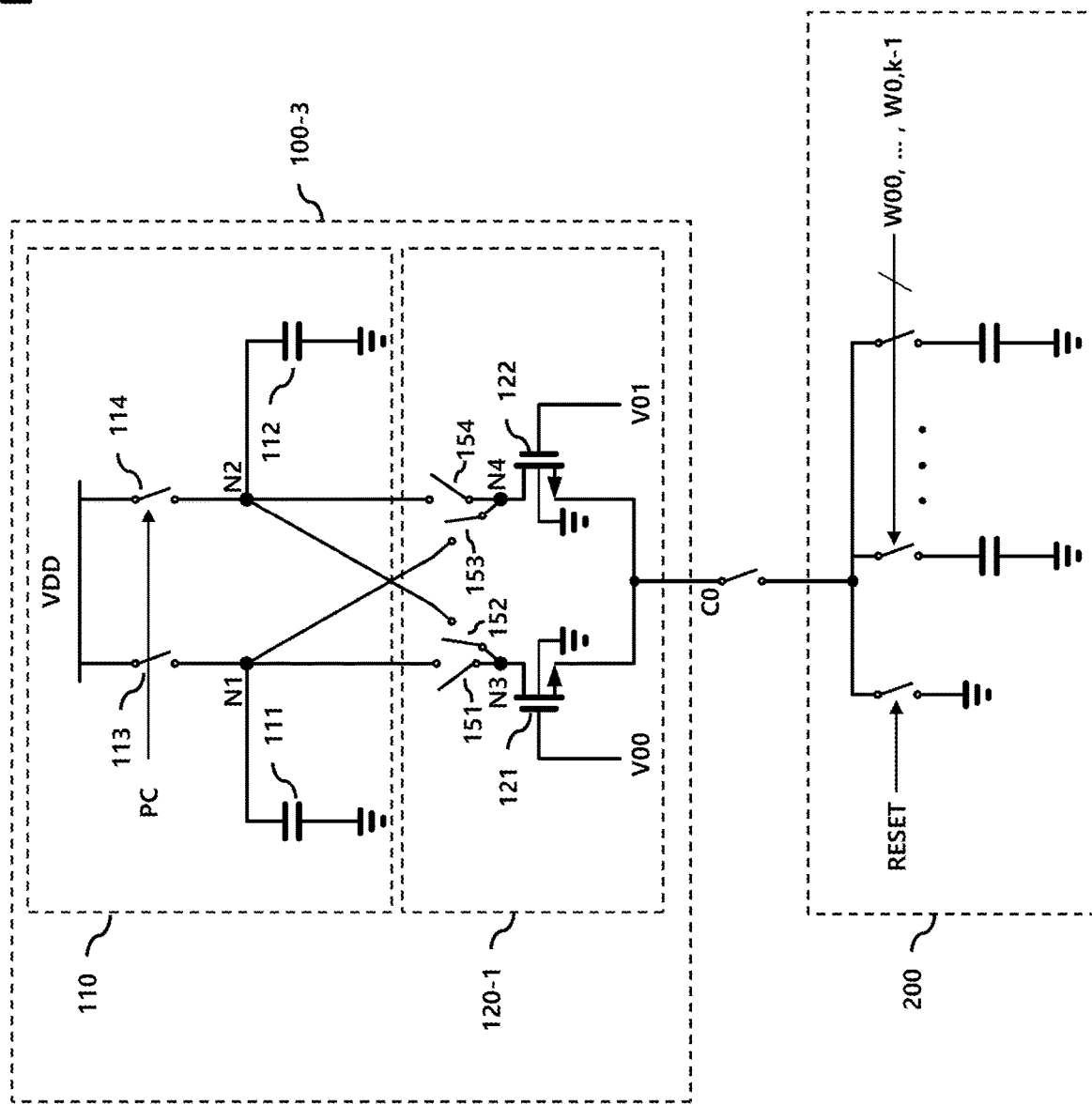

In the embodiment of FIG. 9, the input circuit 120-1 further includes a plurality of switches 151, 152, 153, and 154.

Assuming that the drain of the first transistor 121 corresponds to a third node N3 and the drain of the second transistor 122 corresponds to a fourth node N4, the plurality of switches 151, 152, 153, and 154 are controlled to couple the third node N3 to the first node N1 or the second node N2 and to couple the fourth node N4 to the second node N2 or the first node N1.

For example, when the first node N1 and the third node N3 are coupled together, the second node N2 and the fourth node N4 are coupled, and when the second node N2 and the third node N3 are coupled together, the first node N1 is coupled to the fourth node N4.

Changing the connection of the nodes as above has the effect of setting the sign of the input voltage Vin0 to be negative, and thus has the effect of performing an operation on the first data in a wider range.

In the embodiment of FIG. 9, wherein a plurality of switches are added to each cell block, the size of the cell block may increase.

Figure 10:
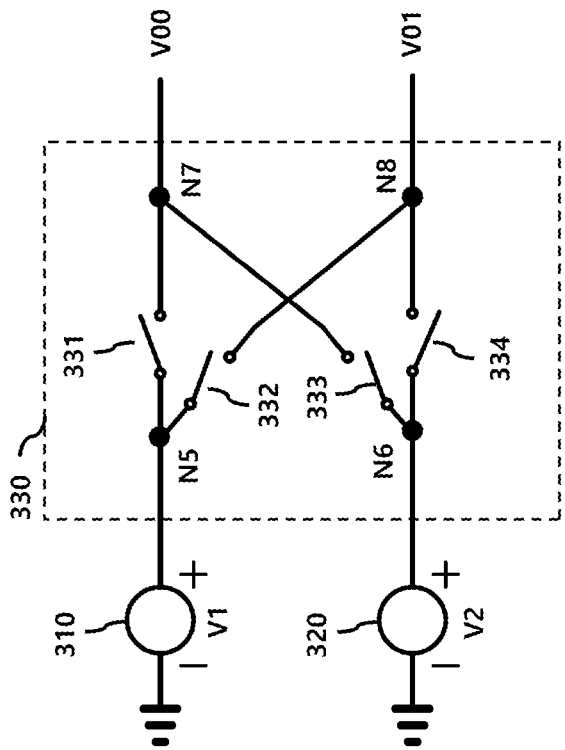
FIG. 10 illustrates a row control circuit according to an embodiment of the present disclosure.

FIG. 10 is a block diagram illustrating a row control circuit 30 according to an embodiment of the present invention.

The row control circuit 30 includes a first voltage generating circuit 310, a second voltage generating circuit 320, and a switching circuit 330.

The first voltage generating circuit 310 and the second voltage generating circuit 320 generate a first voltage V1 and a second voltage V2 respectively in response to the first data D0.

The output terminal of the first voltage generator circuit 310 corresponds to a fifth node N5, the output terminal of the second voltage generator circuit 320 corresponds to a sixth node N6, and a node from which the first differential voltage V00 is output corresponds to a seventh node, and a node from which the second differential voltage V01 is output corresponds to an eighth node N8.

The switching circuit 330 includes a plurality of switches 331, 332, 333, and 334 that couple the fifth node N5 to the seventh node N7 or the eighth node N8 and couple the sixth node N6 to the eighth node N8 or the seventh node N7.

For example, when the fifth node N5 is coupled to the seventh node N7, the sixth node N6 is coupled to the eighth node N8, and when the fifth node N5 is coupled to the eighth node N8, the sixth node N6 is coupled to the seventh node N7.

Like the embodiment of FIG. 9, the embodiment of FIG. 10 may also perform an operation in a wider range of first data.

However, in the embodiment of FIG. 10, the area of the cell block may be reduced because the switching circuit (switches 151 through 154) of FIG. 9 is not included in each cell block.

Figure 11:
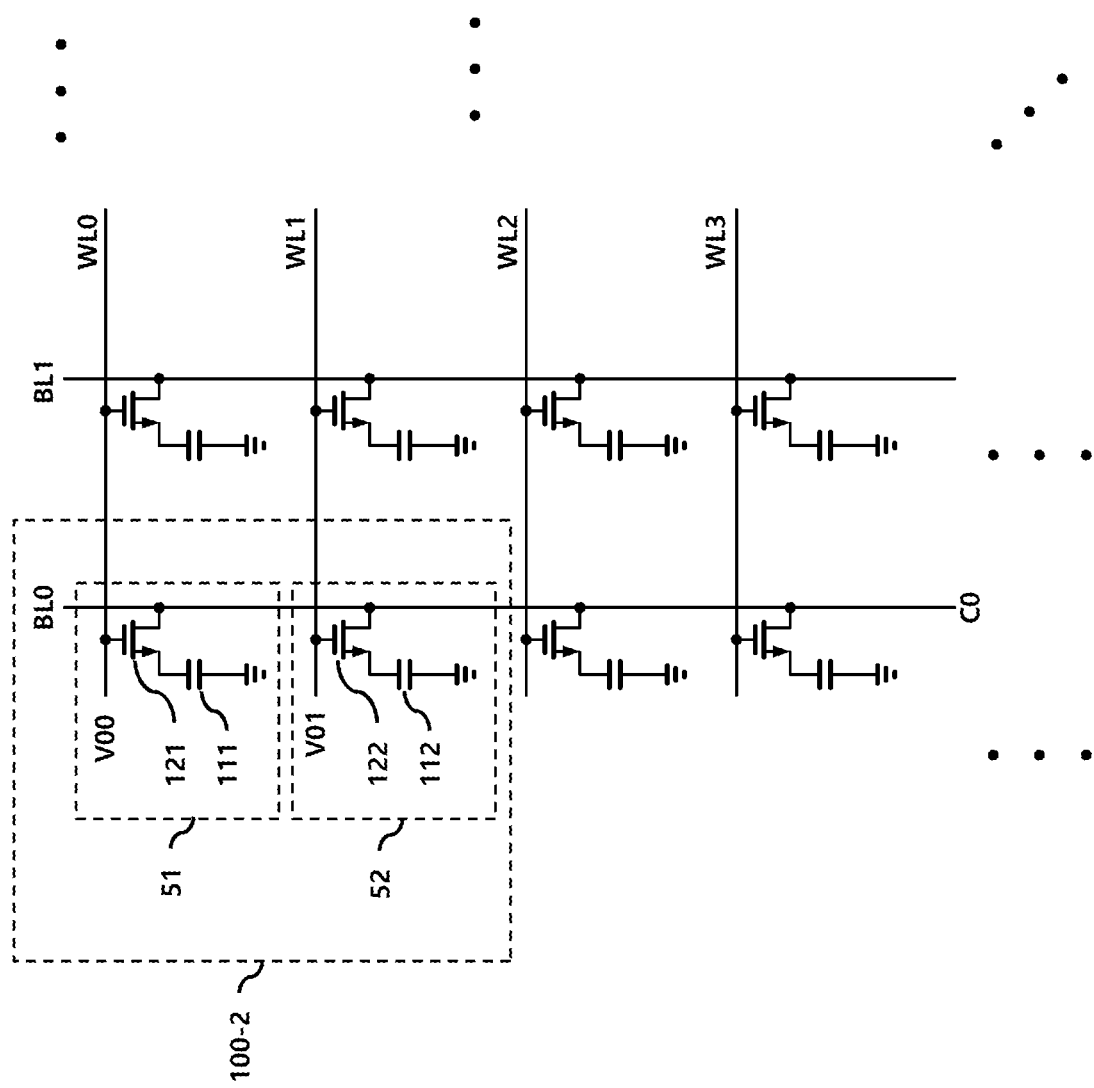
FIG. 11 illustrates a relation between a cell array of a Dynamic Random Access Memory (DRAM) and a cell block according to an embodiment of the present disclosure.

FIG. 11 is a circuit diagram illustrating a relationship between a memory cell array of a DRAM and a cell block according to an embodiment of the present disclosure.

As illustrated, one cell block may be implemented using two memory cells 51 and 52 sharing a bit line BL0.

For example, the two memory cells 51 and 52 correspond to the cell block 100-2 in FIG. 7 or FIG. 8.

That is, the memory cell 51 corresponds to the first transistor 121 and the first capacitor 111, and the memory cell 52 corresponds to the second transistor 122 and the second capacitor 112.

At this time, the first differential voltage V00 is applied to the word line WL0 and the second differential voltage V01 is applied to the word line WL1.

Also, the bit line BL0 corresponds to the column line C0 of FIGS. 7 and 8.

As described above, in the semiconductor device according to the present disclosure, the manufacturing cost can be reduced in that the conventional DRAM cell array can be used as it is.

As described above, a MAC operation is performed using the cell block 100 and the data block 200.

Since a plurality of elements are included in the cell block 100 or the data block 200, an error may occur in the final MAC operation result when nonlinear effects caused by mismatch between the elements, parasitic capacitance, noise of the capacitors, and non-ideal operations of transistors 121 and 122 in the saturation region occurs.

When the element corresponding to the first data is denoted by Di and the element corresponding to the second data is denoted by Wi, the ideal MAC operation result may be expressed by Equation 5.

$$OUT_{ideal} = \Sigma_i D_i \times W_i \quad \text{[Equation 5]}$$

An error component is added to each of the first data and the second data due to the nonlinear effects, and when these are denoted as xi and yi, the actual MAC operation result may be expressed by Equation 6.

$$Out_{real} = \sum_k (D_i + x_i) \times (W_i + y_i) = \sum_k D_i \times W_i + \sum_k x_i \times (W_i + y_i) + \sum_k (D_i + x_i) \times y_i - \sum_k x_i \times y_i \quad \text{[Equation 6]}$$

Equation 6 includes 4 terms. Except for the first term corresponding to the ideal result described in Equation 5, the remaining 3 terms correspond to error components generated due to nonlinear effects.

In Equation 6, the second term corresponds to a case in which all of the first data are 0, the third term corresponds to a case in which all of the second data are 0, and the fourth term corresponds to a case in which both the first data and the second data are 0.

Accordingly, in order to remove an error due to nonlinear effects, the result of Equation 6 may be corrected using values for the three cases.

For example, the second term can be obtained by setting the first data as 0, the third term can be obtained by setting the second data as 0, and the fourth term can be obtained by setting the first data and the second data as 0. Therefore the value of Equation 5 can be obtained by correcting Equation 6 using values of the second, the third, and the fourth terms.

In order to further reduce the mismatch between the transistors 121 and 122, a method of increasing the size of the transistors 121 and 122 may be additionally used.

Although various embodiments have been described for illustrative purposes, it will be apparent to those skilled in the art that various changes and modifications may be made to the described embodiments without departing from the spirit and scope of the disclosure as defined by the following claims.

What is claimed is:

1. A semiconductor device comprising:
    a cell block including:
        a operation circuit having a first capacitor and a second capacitor; and
        an input circuit configured to couple the first capacitor and the second capacitor to a bit line according to differential voltages provided via word lines and corresponding to a value of a first data;
    a data block including a capacitor array having a variable capacitance corresponding to a value of a second data; and
    a coupling switch configured to couple the bit line and the data block.

2. The semiconductor device of claim 1, further comprising a precharge switch configured to precharge the first capacitor and the second capacitor to a power source voltage.

3. The semiconductor device of claim 2, wherein the precharge switch includes a first switch providing the power source voltage to the first capacitor and a second switch providing the power source voltage to the second capacitor.

4. The semiconductor device of claim 2, wherein the precharge switch provides the power source voltage to the bit line.

5. The semiconductor device of claim 2, wherein the precharge switch provides the power source voltage to a terminal of the coupling switch to which the data block is coupled.

6. The semiconductor device of claim 2, wherein the coupling switch is turned on for a predetermined time after the first capacitor and the second capacitor are precharged and the coupling switch is turned off after the predetermined time elapses.

7. The semiconductor device of claim 6, wherein the data block further includes a reset switch that discharges the capacitor array before the coupling switch is turned on for the predetermined time or after the coupling switch is turned off after the predetermined time elapses.

8. The semiconductor device of claim 2, wherein the operation circuit further comprises a first accumulation capacitor selectively coupled in parallel to the first capacitor and a second accumulation capacitor selectively coupled in parallel to the second capacitor.

9. The semiconductor device of claim 8, wherein the coupling switch is turned on and then turned off, and after the coupling switch turned off, the first accumulation capacitor is coupled to the first capacitor for a predetermined time and the second accumulation capacitor is coupled to the second capacitor for a predetermined time.

10. The semiconductor device of claim 9, wherein the precharge switch precharges the first capacitor and the second capacitor to the power supply voltage after the first accumulation capacitor and the first capacitor are decoupled and the second accumulation capacitor and the second capacitor are decoupled.

11. The semiconductor device of claim 8, further comprising a first switch selectively initializing the first accumulation capacitor and a second switch selectively initializing the second accumulation capacitor.

12. The semiconductor device of claim 1, wherein the input circuit includes:
    a first transistor having a gate receiving a first differential voltage, a drain coupled to the first capacitor and a source coupled to the bit line; and
    a second transistor having a gate receiving a second differential voltage, a drain coupled to the second capacitor and a source coupled to the bit line,
    wherein a difference between the first differential voltage and the second differential voltage corresponds to the differential voltages provided via the word lines.

13. The semiconductor device of claim 12, further comprising a first switch coupling a drain of the first transistor to the first capacitor, a second switch coupling a drain of the second transistor to the second capacitor, a third switch coupling a drain of the second transistor to the first capacitor, and a fourth switch coupling a drain of the first transistor to the second capacitor.

14. The semiconductor device of claim 12, further comprising a row control circuit configured to provide the first differential voltage and the second differential voltage according to the first data.

15. The semiconductor device of claim 14, wherein the row control circuit includes:
    a first voltage generating circuit configured to generate a first voltage according to the first data;
    a second voltage generating circuit configured to generate a second voltage according to the first data; and a switching circuit configured to provide the first voltage as the first differential voltage or the second differential voltage and to provide the second voltage as the first differential voltage or the second differential voltage.

\* \* \* \* \*